(12) United States Patent
Ritamaki et al.

(10) Patent No.: US 8,251,295 B2
(45) Date of Patent: Aug. 28, 2012

(54) RFID TAG

(75) Inventors: Matti Ritamaki, Nokia (FI); Heikki Ahokas, Tampere (FI); Jarkko Miettinen, Ylojarvi (FI); Hanna Luoma-Aho, Tampere (FI)

(73) Assignee: Confidex Oy, Tampere (FI)

( * ) Notice: Subject to any disclaimer, the term of this patent is extended or adjusted under 35 U.S.C. 154(b) by 235 days.

(21) Appl. No.: 12/598,159

(22) PCT Filed: Apr. 25, 2008

(86) PCT No.: PCT/FI2008/050232
§ 371 (c)(1),
(2), (4) Date: Feb. 17, 2010

(87) PCT Pub. No.: WO2008/132287
PCT Pub. Date: Nov. 6, 2008

(65) Prior Publication Data
US 2011/0017832 A1 Jan. 27, 2011

Related U.S. Application Data

(60) Provisional application No. 60/924,008, filed on Apr. 26, 2007.

(51) Int. Cl.
*G06K 19/06* (2006.01)
(52) U.S. Cl. ........................ 235/492; 235/487
(58) Field of Classification Search .............. 235/385, 235/439, 382, 380, 487, 492
See application file for complete search history.

(56) References Cited

U.S. PATENT DOCUMENTS
2010/0019035 A1* 1/2010 Larson et al. ............. 235/385

FOREIGN PATENT DOCUMENTS
| DE | 102 35 771 A1 | 2/2004 |
| EP | 1 522 957 A1 | 4/2005 |
| EP | 1 548 639 A1 | 6/2005 |
| WO | 2004/012896 A1 | 2/2004 |
| WO | WO/2006/031501 A1 | 3/2006 |

OTHER PUBLICATIONS

International Search Report issued Sep. 11, 2008 in corresponding International Application No. PCT/FI2008/050232.
Examination Report for European Patent Application No. 08775451.1, mailed Mar. 11, 2011, 5 pages.
Examination Report for European Patent Application No. 08775451.1, mailed Oct. 7, 2010, 3 pages.
Written Opinion for PCT Application No. PCT/FI2008/050232, mailed Sep. 11, 2008, 5 pages.

* cited by examiner

*Primary Examiner* — Karl D Frech
(74) *Attorney, Agent, or Firm* — Holland & Knight LLP; John P. Moran, Esq.

(57) ABSTRACT

The present invention relates to an RFID tag comprising a heat-resistant substrate made of a plastic film and capable of withstanding temperatures up to 200° C., an antenna formed on the surface of the substrate, an integrated circuit on a silicon chip electrically connected to the antenna and a joint for attaching the chip to the substrate on that the chip is capable of connecting electrically to the antenna. The joint is made of an anisotropically conductive adhesive capable of withstanding temperatures up to 200° C. and having a thermal expansion coefficient essentially similar to that of the silicon chip.

9 Claims, 8 Drawing Sheets

RFID TAG

CROSS-REFERENCE TO RELATED APPLICATIONS

Figure 2:
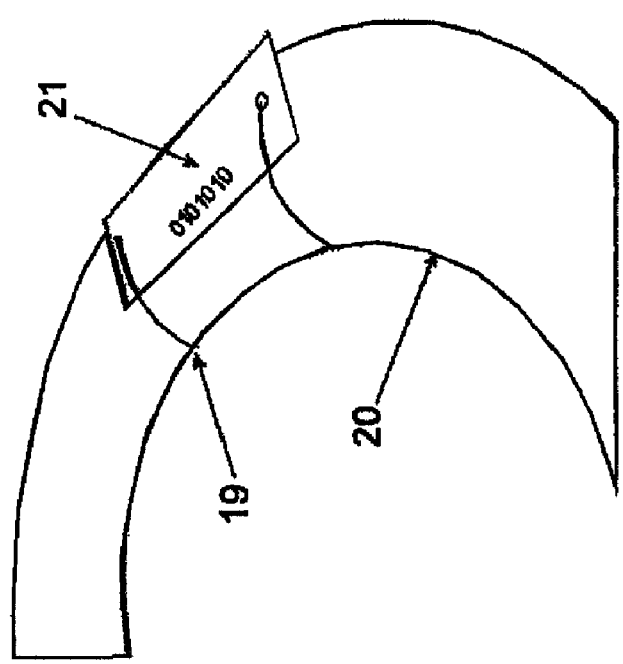

This application is the U.S. national stage of International (PCT) Patent Application No. PCT/FI2008/050232, filed Apr. 25, 2008, which claims priority to U.S. Provisional Patent Application No. 60/924,008, filed Apr. 26, 2007. The entire disclosures of these two applications are incorporated herein by reference in their entireties.

BACKGROUND OF THE INVENTION

Field of the Invention

RFID applications in industry concerning high temperature and demanding chemical applications usually require high-cost tags with an expensive but heat-resistant encapsulation. Most of the known industrially manufactured tags for harsh conditions are very expensive printed circuit boards, and they are encapsulated, being thus extremely expensive and rigid.

One special application in the field of the high temperature RFID tags is a tire tag. The tire tag should resist the harsh tire vulcanizing process which involves high temperatures and pressures. The existing tire tags are quite expensive and they comprise heat resistant encapsulations because without special structures the RFID transponder would break down. The tire tags may be embedded in the tire which is a disadvantage because an embedded tag can cause unexpected failure of the tire.

Publication U.S. Pat. No. 6,255,949 discloses in FIGS. 5 and 6 a high temperature RFID tag which comprises a flexible circuit board substrate, an IC circuit and an integrated circuit device, i.e. a chip. The integrated circuit device is bonded to the substrate by conventional means. On the top surface of the substrate there is a thermally resistant, substantially flexible silicone encapsulant. On the bottom surface of the substrate there is a high temperature adhesive.

SUMMARY OF THE INVENTION

The high temperature RFID tag according to the present solution provides several advantages. The structure of the tag is flexible since the tag is manufactured in the reel-to-reel format (as a label type product). Thus, it is possible to manufacture the tags in high volumes and in a cost-efficient manner. Further, the tags may be attached to objects by labeling machines whose use is an inexpensive way to accomplish the tagging.

The tag of the present solution may be utilized, for example, in automotive, petrochemical and heavy industries.

In automotive industry, the tag may be used to follow a vehicle chassis in coating processes, for example, when it is in a painting oven or an electrolyte bath. However, the utilization of the tag in other metal parts manufacturing and painting processes is also possible.

In petrochemical and heavy industries, the tag provides a solution to the requirement for a durable identification tag. For example, the marking of cables, pipes and devices in off-shore plants or steel refinery plants requires the use of materials which are resistant to high temperatures and harmful gases.

Yet another application area is the disinfection of instruments by means of autoclave process ovens e.g. in hospitals.

Concerning the tire tag, the tag of the present solution is resistant to the harsh vulcanizing process, provides a long reading range and can be manufactured in a reel-to-reel process. The tag, i.e. the transponder, is attached to the tire in the tire building phase, and the tire can be traced through the whole manufacturing process until shipping.

The tire tag is attachable to the surface of the tire , i.e. it is not embedded in the tire body, since the tire should not contain any extra materials to avoid unexpected failures. In practice, the tag may be attached to the surface of the tire mould in order to fasten the tag to the tire.

The flexible thin tag structure also enables the user to use visual marking of the tag easily by a reel format printing process, which is not possible for single tags whose marking is costly and slow.

Especially in identification applications where the visual marking is difficult to read or the risk of mis-identification is even life-critical (petrochemical applications), a high-temperature and chemical resistant RFID tag is useful. The requirement for item level identification also requires a low-cost and high-volume product, to which this innovation brings a solution.

All in all, the present solution provides a tag which is resistant to high temperatures, i.e. temperatures at least up to +200° C. and preferably up to +250° C. In addition to the high temperature, the tag may be subjected to a high moisture content or vaporized chemicals. However, the tag according to the present solution resists all these conditions without breaking or peeling off the laminated structure or deforming in such a manner that the tag cannot be used any longer. For example, the tendency of the chip to come off the antenna has been solved in this solution by creating such a bond between the chip and the antenna that neither electrical nor mechanical properties are lost in high temperature conditions.

BRIEF DESCRIPTION OF THE INVENTION

There are a few factors which have an effect on the proper functioning of the tag in high temperature conditions and in conditions where there are, in addition to the high temperature also other disadvantageous conditions present, such as vaporized chemicals. The high temperature RFID tag has to be mechanically stable at high temperatures. If the thermal properties of the materials do not match, the inlay, i.e. the basic substrate, will bend and eventually the silicon chip attachment will fail.

The basic substrate should resist high temperatures and, in addition to the high temperatures, harsh chemicals in some applications. The antenna may be designed so that its structure is adapted to conform to the changes of temperatures. The antenna layout may comprise, for example, one or more winding parts which make a well-balanced thermal expansion possible. The material which is used for attaching the chip to the substrate should be thermally matched with the silicon chip or other material of the chip. If the thermal expansion of the material is totally different from that of the chip, then the contact between bump and antenna pad will fail at high temperatures. The material will crack if it is not suitable for high temperatures. For example, the material should have a high glass transition temperature which is at least above 200° C., preferably above 250° C. The material may comprise additives which increase the flexibility of the material so that it cushions the effect of the thermal expansion of the substrate and the antenna. The material between the chip and the substrate is usually an anisotropically conductive paste (ACP). Further, it is possible to secure the electrical connection between the chip and the antenna in the chip connection area (pad area) so that more than one antenna port is used, i.e. the chip may be provided with four bumps which are each connected to the antenna, thus forming a double-secured joint. The chip is usually a silicon chip, and the first, preferred embodiment described below relates to the silicon chip. However, chips made of another suitable material, for example a polymeric material, are feasible as well if their temperature resistance is adequate.

In addition to the above-mentioned features, adhesives and face and backing films may play an important role. The adhesives, such as pressure-sensitive adhesives, have to stand high temperatures without boiling because boiling causes voids under the face lamination. The face lamination protects the inlay with the antenna and the chip against mechanical impacts. The face lamination may be made of paper or a heat-resistant plastic material, such as polynaphtalene (PEN).

There are different options to build the high temperature tag. However, the RFID tag should comprise a heat-resistant substrate, an antenna, an integrated circuit on a chip and such a joint which electrically connects the chip and the antenna. In practice, it is possible to form the antenna on the heat-resistant substrate and to attach the chip directly to the antenna. Another option is to form a part of the entity that forms the antenna on one substrate and a part of that entity on another substrate and to attach the chip to the last-mentioned substrate. Both of the both substrates are attached together in order to form an RFID tag.

The heat-resistant substrate should be able to withstand the maximum temperature to which it is to be exposed. Due to the manufacturing process the substrate should be adequately flexible and typically it is made of a plastic film, such as a polynaphthalene (PEN) film, a polymide (PI) film, a polyethylenetherephtalate (PET) film or a polyester film, but also a paper substrate is possible. The typical thickness of the plastic film is from 30 to 120 µm.

The antenna has been formed on the surface of the substrate. The antenna can be manufactured, for example, by printing, etching, die-cutting, vaporizing, sputtering or by some other additive technique. The antenna comprises an electrically conductive material, such as copper, aluminium, or silver.

The integrated circuit on a chip is typically a silicon chip which is electrically connected to the antenna. The joint for attaching the chip to the substrate so that the chip is capable of connecting electrically to the antenna is formed of an electrically conductive material, such as an anisotropically conductive paste or film. It should be noted that the integrated circuit on the chip is attached to the antenna either capacitively, inductively, or by an ohmic contact. However, all these connections are referred to as electrical connections in this application.

According to one preferred embodiment, the joint is made of an anisotropically conductive adhesive capable of withstanding temperatures up to 200° C. and having a thermal expansion coefficient essentially similar to that of the silicon chip. The joint may be made, for example, of a heat-curing paste comprising a modified addition compound of an epoxy amine and metallic particles, such as NiAu particles.

In addition to the above-mentioned specific adhesive, the RFID tag according to the present embodiment may comprise one or more of the features below:

The antenna may have a special layout so that the thermal expansion does not damage it. For example, the antenna may comprise winding parts and/or a symmetrical layout. The RFID tag may comprise arched supporting arms which at least partially surround the silicon chip so that the supporting arms form a protective ring around the chip. The supporting arms may form a part of the antenna and they are usually manufactured by using the same technique and same materials as the antenna. The chip may be provided with four bumps which are each connected to the antenna, thus forming a double-secured joint. The RFID tag may comprise two impedance matching elements instead of one impedance matching element. There may also be separate patterns formed on the surface of the substrate in order to balance the tag when it is exposed to heat. Further, the chip may be encapsulated by using the so-called glob top encapsulation.

All the features mentioned above in connection with the preferred, first embodiment may be integrated in one RFID tag but it is possible that only one or some features are selected for one RFID tag in addition to the special anisotropically conductive adhesive.

According to another, second embodiment, the joint may made by using a heat-resistant material, such as an anisotropically conductive paste, a solder paste or an isotropically conductive paste, but one or more enhancements will be used for creating a properly functioning RFID tag.

The antenna may have a special layout so that the thermal expansion does not damage it. For example, the antenna may comprise winding parts and/or a symmetrical layout. The RFID tag may comprise arched supporting arms which at least partially surround the silicon chip so that the supporting arms form a protective ring around the chip. The supporting arms may form a part of the antenna and they are usually manufactured by using the same technique and same materials as the antenna. The chip may be provided with four bumps which are each connected to the antenna thus forming a double-secured joint. The RFID tag may comprise two impedance matching elements instead of one impedance matching element. There may also be separate patterns formed on the surface of the substrate in order to balance the tag when it is exposed to heat. Further, the chip may be encapsulated by using the so-called glob top encapsulation.

All the features mentioned above in connection with the second embodiment may be integrated in one RFID tag but it is possible that only one or some features are selected to one RFID tag.

The manufacturing method of the tag is based on roll-to-roll operations. It is possible to form the whole electrically conductive pattern on a heat-resistant substrate, and then to attach and connect the integrated circuit on the chip electrically to the antenna. Another option is to form an entity comprising the part of the electrically conductive pattern onto which the chip is to be attached on the heat-resistant substrate, and to attach the chip to that part. After the chip has been attached to the substrate, the heat-resistant substrate is attached to a substrate which comprises the rest of the electrically conductive pattern.

DETAILED DESCRIPTION

Figure 1:
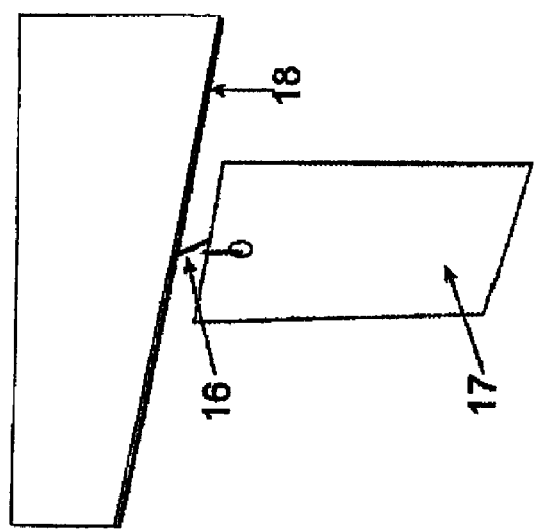
Figure 3:
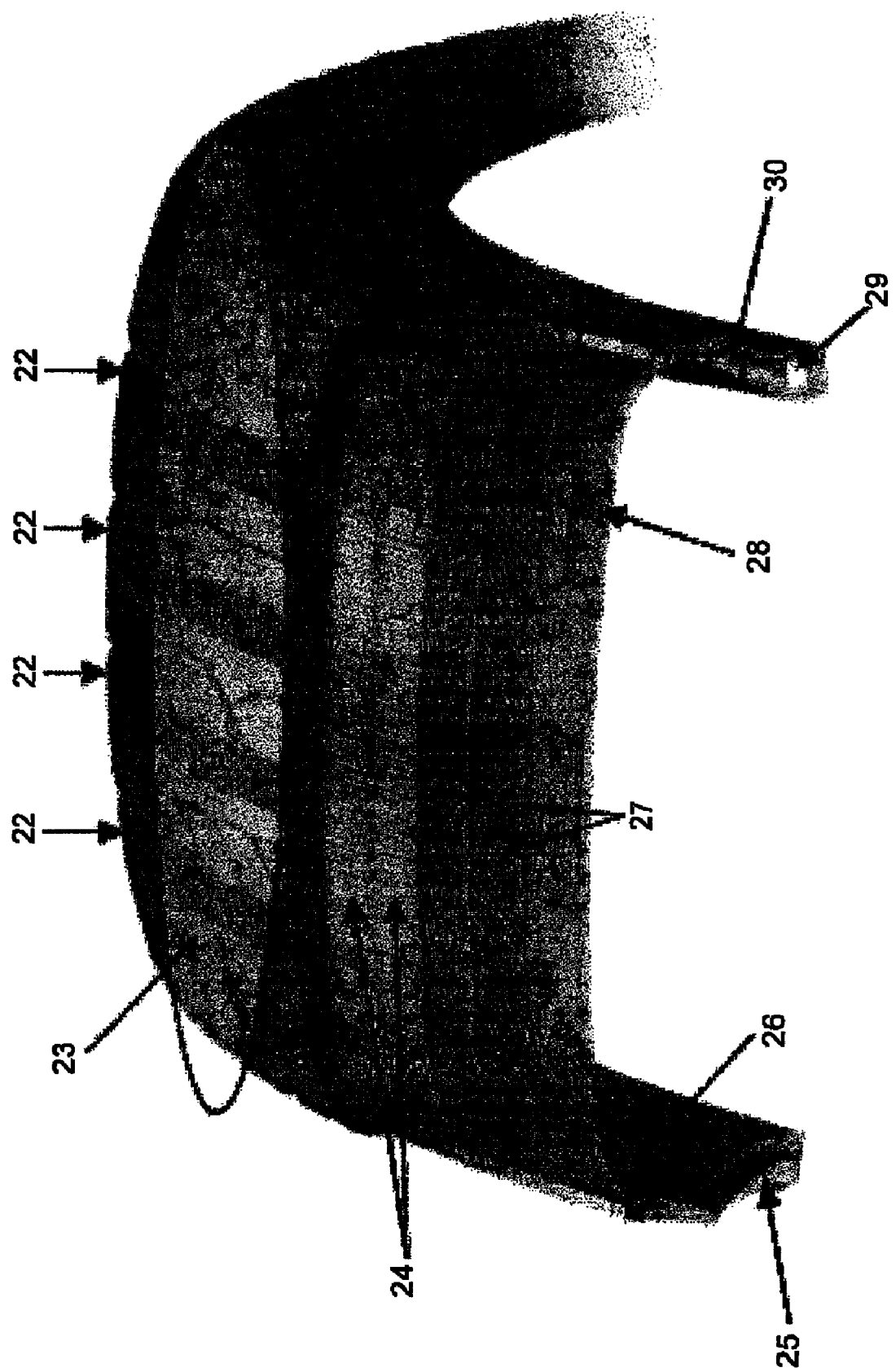
Figure 4:
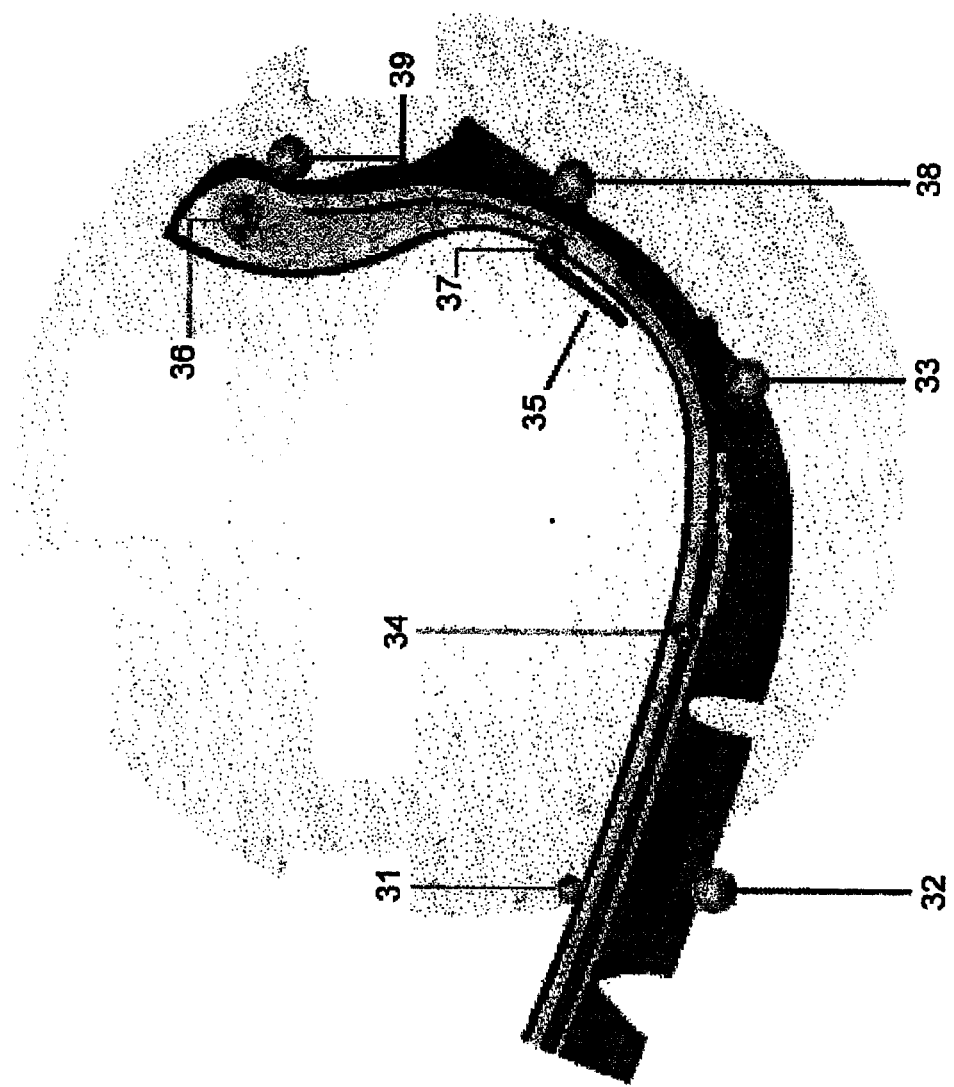
Figure 5:
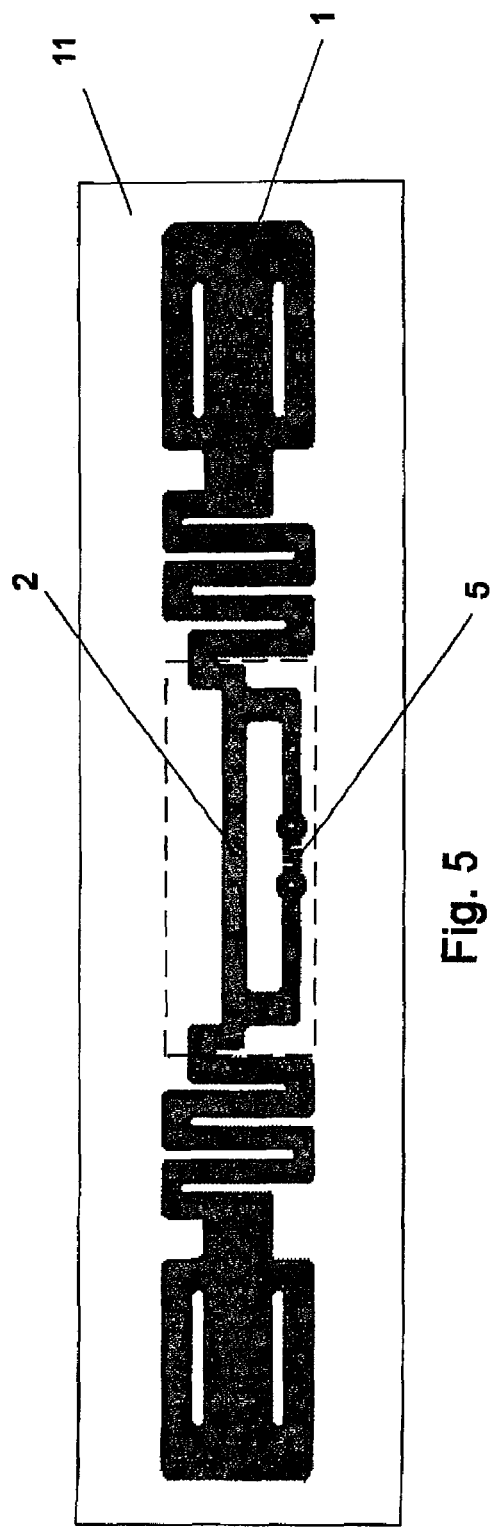
Figure 6:
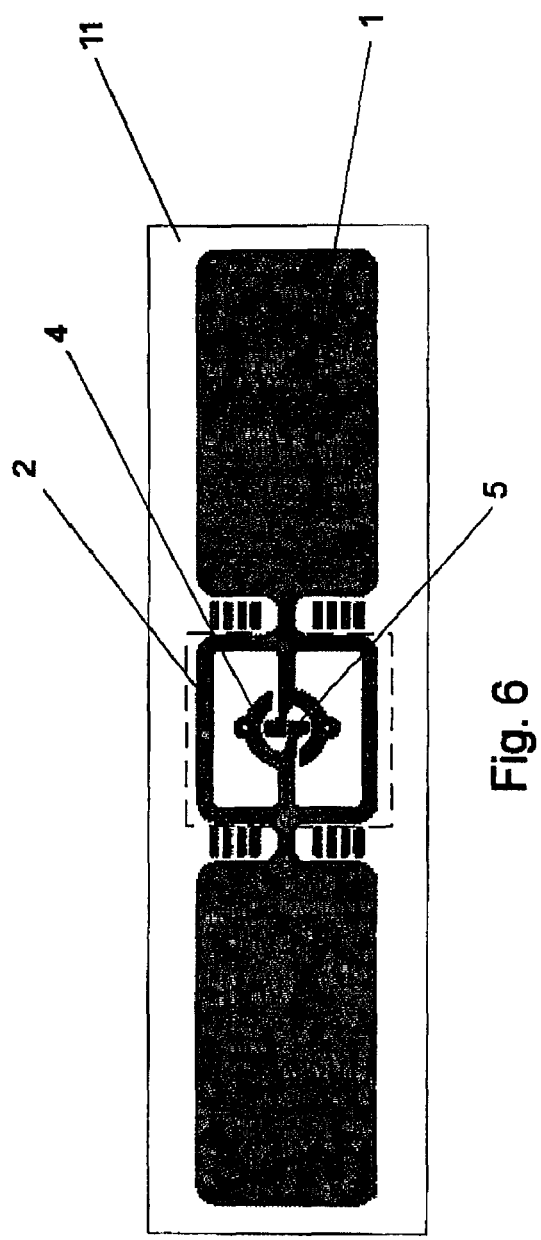
Figure 7:
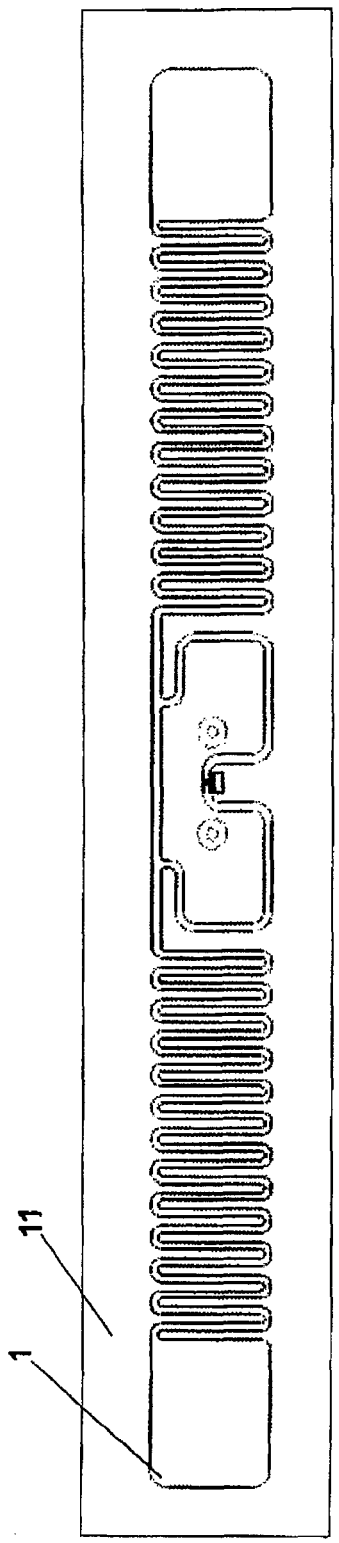
Figure 8:
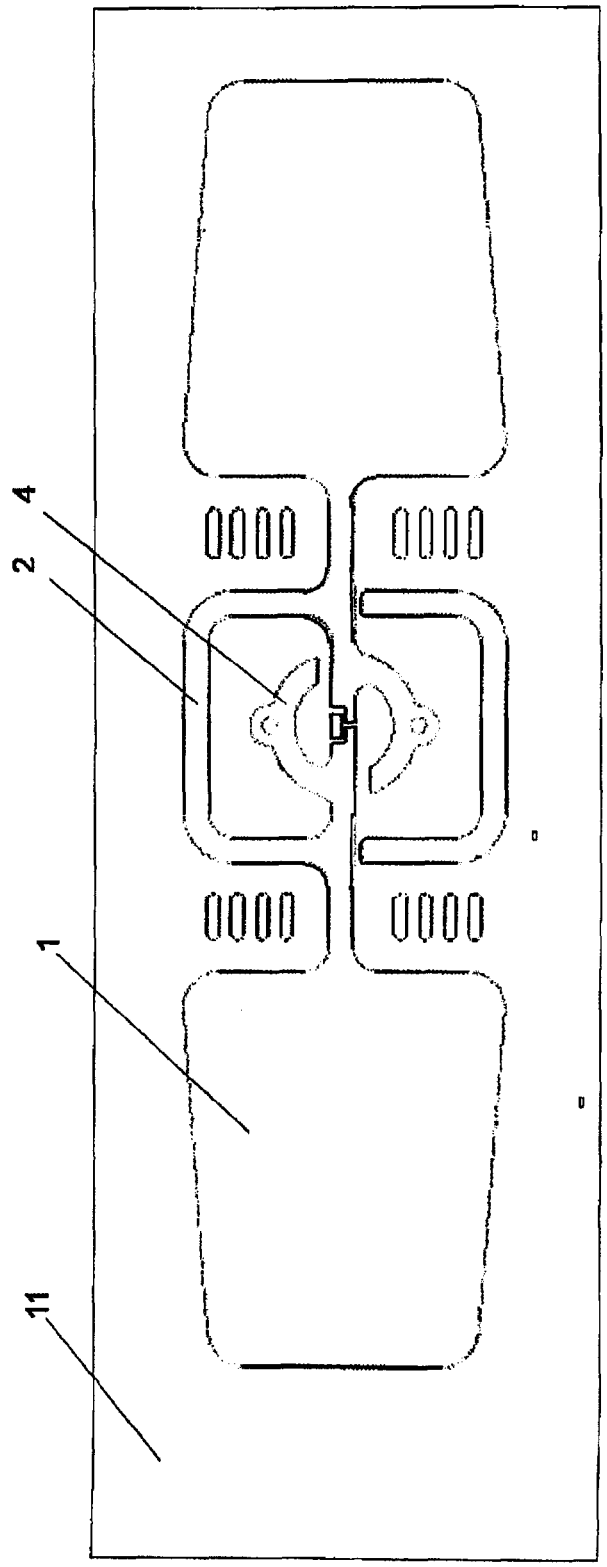
Figure 9:
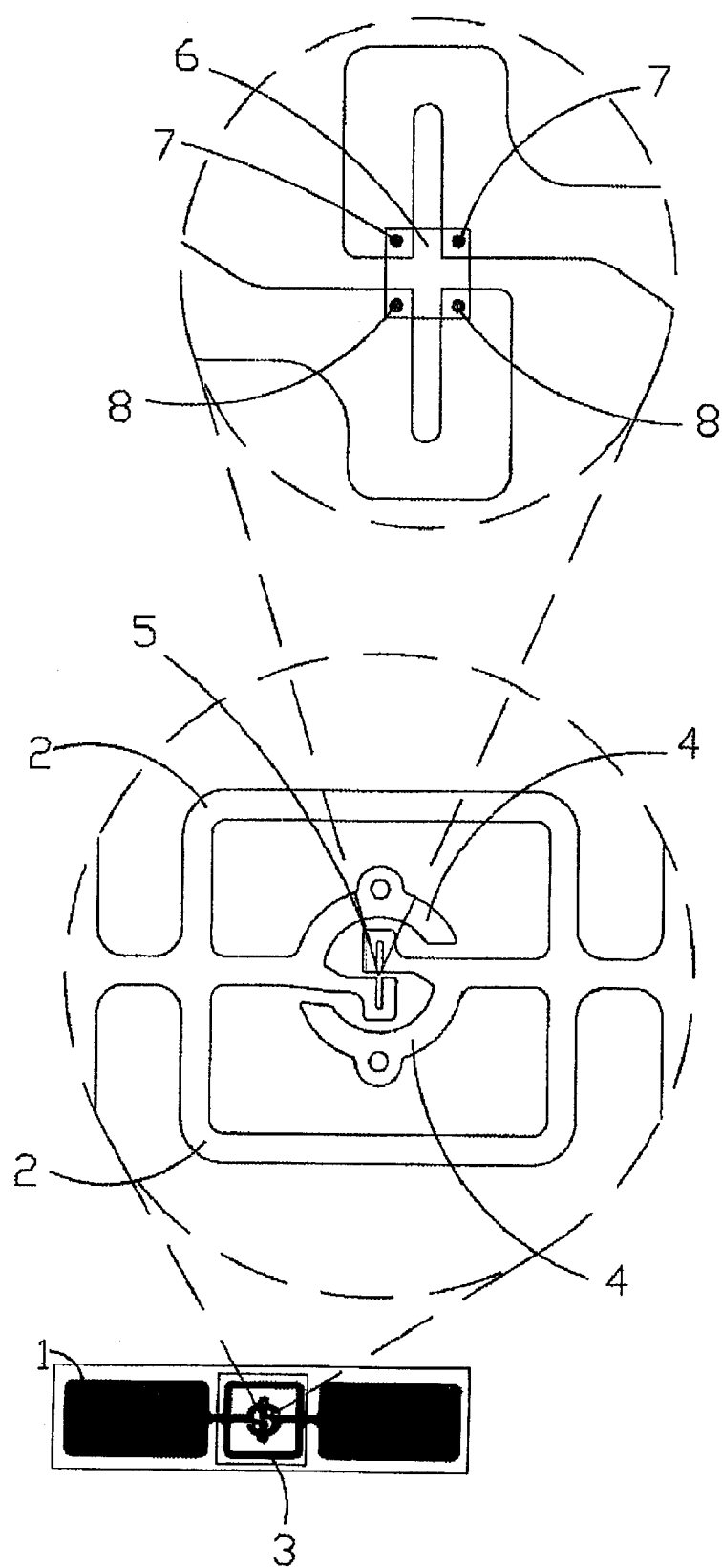
Figure 10:
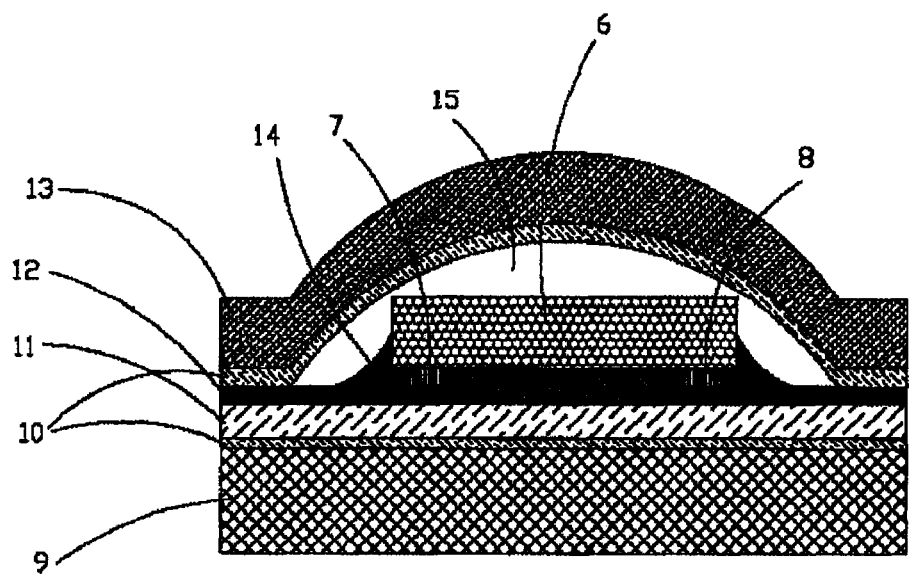
Figure 11A:
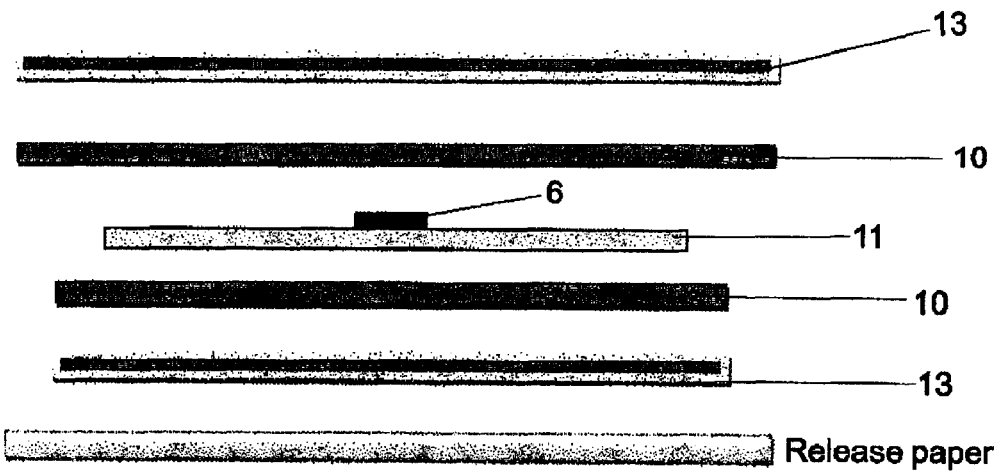
Figure 11B:
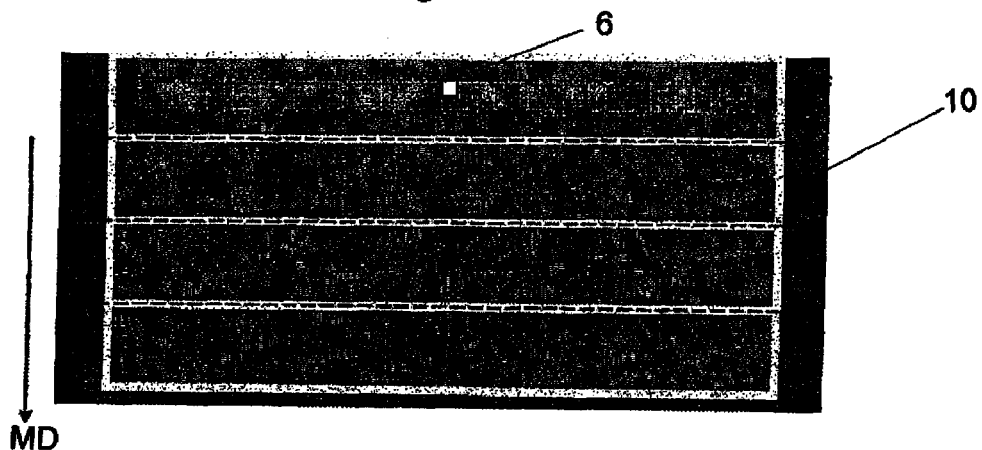
Figure 12:
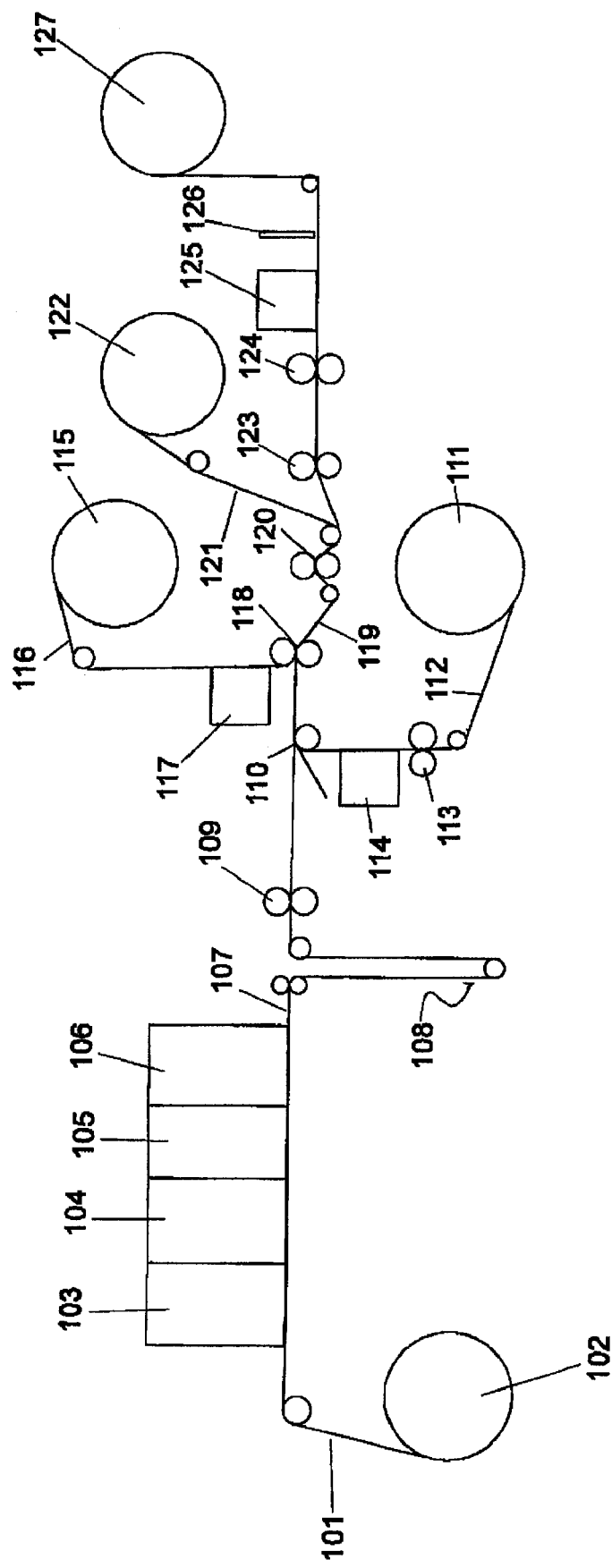

In the following, the invention will be described by referring to figures in which FIG. 1 shows a tag fixing on a metallic vehicle chassis, FIG. 2 shows a tag fixing on a pipe, FIG. 3 shows a structure of a tire, FIG. 4 shows a structure of a tire in a cross-sectional view, FIG. 5 shows a possible antenna structure for a high temperature RFID tag from above, especially useful as a free hanging high temperature tag, FIG. 6 shows another possible antenna structure for a high temperature RFID tag from above, especially useful as a tire tag, FIG. 7 shows yet another possible antenna structure for a high temperature RFID tag from above, FIG. 8 shows yet another possible antenna structure for a high temperature RFID tag from above, especially useful as a tire tag, FIG. 9 shows details of the tag of FIG. 6, FIG. 10 shows a cross-sectional view of the tag at the chip, FIG. 11a shows a cross-sectional view of a high temperature RFID tag (the different layers are illustrated separately for the sake of clarity), FIG. 11b shows a web comprising sequential tags, the web seen from below, and FIG. 12 shows a possible process line.

The RFID transponder consists of several structures which are required in order to achieve reliable functionality through the manufacturing process in which the RFID transponder is to be used. High temperature properties of the transponder are enhanced by following methods:

exploiting all four bumps 7, 8 of the silicon chip (see FIG. 9), adding supporting arms 4 around the silicon chip mounting area (see FIG. 9), two parallel impedance matching loops 2 (see FIG. 9), high temperature substrate material 11 (see FIG. 10), ACP 14 which resists high temperatures without degrading and has thermal expansion properties similar to those of silicon (see FIG. 10), glob top encapsulation 15 over the silicon chip (see FIG. 10), paper face lamination 13, which reduces mechanical tension and pressure during the vulcanization phase (see FIG. 10).

It should be noted, however, that not all of the above-mentioned enhancements may be necessary in one RFID transponder but a suitable mix is selected from the list above.

FIG. 1 shows a tag fixed to a metallic vehicle chassis. The high temperature RFID tag 17 has to be attached mechanically, e.g. by a metal hook 16, to the end use object 18, such as a vehicle chassis, an instrument cabin for autoclave, or other devices used in high temperature conditions. Pressure sensitive adhesives may not be sufficiently reliable. Holes in the tag can be used for attaching the tag. Spot welding of car parts can also be used to fix the tag to the chassis or other metal parts of a car which are forwarded to painting and other further processes.

FIG. 2 shows a tag fixed to a pipe. In demanding identification applications, the tag 21, which may be a high temperature tag with printed data, is usually mounted either by wires 19 or special holders. For example, electrical cables 20 or pneumatic tubes require strong fixings where the tag is attached. Correct placement with low-dielectric intermediate materials enables the tag to be read from these places even if they contain metallic materials.

A different kind of fixation is shown in FIG. 11b which shows a web comprising sequential tags so that the web is seen from below. As one can see, the upper plastic film and the upper adhesive film extends further than the inlay so that the exposed adhesive layer 10 is ready to be glued on a surface after the release paper is removed.

FIG. 3 shows the structure of a tire and FIG. 4 shows the structure of a tire in a cross-sectional view. Concerning the application in the tires, the RFID tire tag can be used for the identification of tires in their manufacturing process. The tire manufacturing consists of harsh process phases in terms of temperature and pressure. Especially vulcanization is a challenging environment for an electronic device, such as an RFID transponder.

Steel belts 27 (see FIG. 3) and bead wires 29 decrease the performance of an RFID tag antenna. The side wall of the tire is a good place for the tag, i.e. a transponder 35 (see FIG. 4) since it does not contain any metallic structures. On the other hand, tension is very high in this area. The RFID transponder has to be inside the tire, because otherwise it would cause visual defects on the tire.

In the following, the enhancements already listed in the beginning of this chapter will be explained more thoroughly one at a time:

Exploiting More Than One Antenna Ports

Typically, only one antenna port is used in the RFID transponder. One bump is the ground and the other is the active bump. If one connection between the bump and the mounting pad fails, then the whole transponder is broken, i.e. it cannot be identified any longer. In this innovation, the reliability of identification is enhanced by using two antenna ports instead of one (FIG. 9). Some RFID silicon platforms support two separate ports. Such silicon comprises four bumps 7, 8, namely two ground bumps and two active antenna bumps. The transponder can be identified with a shortened reading range even if one or even two connections (one ground connection and one active connection) fail.

Supporting Arms Over Mounting Area

Supporting arms 4 (FIG. 9) over the silicon mounting area will make the area over silicon more stable in terms of tension and bending. Supporting arms made of metallic material, such as copper or aluminium, focus mechanical stresses on other parts of the antenna layout. Metal is also much stronger than the substrate material 11 itself.

The supporting arms 4, often two in number, typically surround the chip so that they are able to freely expand or contract due to dimension changes caused by the temperature. In such a manner the area around and under the chip is more stable. The supporting arms 4 are often formed so that the electrically conductive leads, which contact with the chip, branch into two.

Typically, the supporting arms 4 form a discontinuous ring around the chip mounting area as shown in FIG. 9.

Two Parallel Impedance Matching Loops

The impedance of the RFID silicon has to be matched to the antenna impedance. Typically, this is done with an inductance loop 2 over silicon (FIG. 9). The inductance of the loop is to be matched with the capacitance of the silicon, which will maximize the reading range of the transponder. The advantage of using two parallel loops over the silicon is that the tension at the high temperature, such as in a vulcanization process, is divided by two. Now, the mounting area has a shielding ring over the silicon, i.e. the tension is not directly focused on the silicon mounting area.

High-Temperature Substrate Material

The stability of the substrate material 11 is extremely important in terms of tension at high temperature (FIG. 10). Polyimide or an equivalent substrate can be used. The dimensions of the substrate have to remain essentially the same at high temperature and pressure. A PET substrate is also usable in certain applications.

ACP (Anisotropically Conductive Paste) Thermal Expansion Properties

Different thermal expansion properties of materials would cause failures in the silicon chip attachment. The thermal properties of the chip and ACP 14 have to match, i.e. they have to be essentially similar. The thermal expansion coefficient of silicon (linear) is $4.68 \times 10^{-6}$/K.

As the ACP has to resist to high temperatures, normal ACP cannot be used. An example of a suitable ACP is a Delo adhesive (Delo Industrial Adhesives, Germany) from the product family AC VE. The adhesive is based on modified addition compound of an epoxy amine. It is a one-component, solvent-free, heat curing adhesive. The adhesive comprises NiAu (nickel/gold) particles having an average diameter of 2.5 μm. Its flexibility may be tailored by adjusting the ratio of the reactants.

Glob Top or Film Lamination Encapsulation

In applications in which bending of the transponder is expected it is possible to use special arrangements. Typically, the tire mould comprises shapes with a small radius. A small radius near the silicon might crack it mechanically. The bending radius can be increased by adding an extra lamination layer between the face lamination and the inlay. Another method to encapsulate the silicon is to use a glob top 15. The glob top form a hermetic encapsulation for the silicon. The material of the glob top is often a special plastic material which has a low coefficient of thermal expansion.

Face Lamination

Face lamination will form a mechanical shield for the inlay. Paper lamination or some other material which does not expand at high temperature can be applied. The face lamination 13 will relieve the tension of the inlay in the vulcanization process. The inlay can slide easily under the face lamination, due to a pressure sensitive adhesive. Therefore, most of the mechanical stress is suppressed on the paper face material instead of the inlay.

The inlay substrate 11 has to be resistant to high temperatures. An example of such a substrate is Kapton® polyimide film (Katco Ltd, United Kingdom). An example of a surface film 13 laminated on the substrate is Ultem® polyetherimide film (Katco Ltd, United Kingdom) (see FIG. 11a in which is shown a cross-sectional view of a high temperature RFID tag). Suitable films are also polynaphtalene (PEN) and polyetheretherketone (PEEK). Adhesives 10 which are useful in laminating the substrate and the surface film together include acrylic adhesives, preferably adhesive films, which resist high temperatures, such as high performance acrylic adhesives from 3M.

Manufacturing

In the following, possibilities to manufacture the high temperature RFID label will be described:

The manufacturing method is based on roll-to-roll operations. It is possible to form the whole electrically conductive pattern on a heat-resistant substrate, and then to attach and to connect the integrated circuit on the chip electrically to the antenna. Another option is to form an entity comprising the part of the electrically conductive pattern onto which the chip is to be attached on the heat-resistant substrate, and to attach the chip to that part. After the chip has been attached to the substrate, the heat-resistant substrate is attached to a substrate which comprises the rest of the electrically conductive pattern. In FIGS. 5 and 6 it is shown by dashed lines which part of the RFID tag could be manufactured separately. However, those shown in FIGS. 5 and 6 are not the only options.

In the following it will be described how to manufacture a heat-resistant RFID tag when there are two separate webs, one including impedance matching elements one after another and the other including the rest of the electrically conductive pattern, in this case antennas, one after another.

At first, sequential impedance matching elements are formed on a surface of a web. The impedance matching elements create a conjugate matching between an integrated circuit on a chip and an antenna. The impedance matching elements can be manufactured, for example, by printing, etching, die-cutting, vaporizing, sputtering or by some other additive technique on the surface of the web. The impedance matching element comprises an electrically conductive material, such as copper, aluminium, or silver. The web is typically a plastic web, such as a polyimide web.

In the next process phase, the integrated circuit on the chip is attached to every impedance matching element, thus forming structural modules. The chip can be a silicon chip or a polymer chip if the polymer chip is adequately heat resistant. There are several possibilities to attach the chip to the antenna, for example by using solder paste, isotropically conductive adhesive, or anisotropically conductive adhesive. The anisotropically conductive adhesive is preferred. The adhesive can be a film or a fluid adhesive which will be dried and/or cured. The aim is that an electrical connection is formed between the impedance matching element and the chip.

It is possible that the polymer chip is printed on a substrate at the same time when the impedance matching element is printed on the substrate. Thus a complete structural module can be formed in a single process step on the same production line. The structural module can be connected capacitively to the antenna, or an ohmic contact can be formed by using for example an electrically conductive paste.

After the structural modules comprising the impedance matching elements and the chips have been formed, the structural modules are tested. Next, the web is cut so that the individual structural modules are separated from each other, and structural modules which do not function properly are removed. The structural modules are attached to a product substrate which is also heat resistant but may have poorer quality with respect to the dimensional stability in the elevated temperature. The individual structural modules are placed on the surface of the product substrate so that their mutual distance on the substrate is longer than their mutual distance on the original web. The structural modules are attached to the substrate adhesively or in some other way.

The impedance matching elements of the structural modules are attached to the antennas so that the impedance matching elements and the antennas form a capacitive or an ohmic contact. The antennas may be produced roughly with respect to their material and shape.

Next, possible process lines for inlay manufacturing will be described:

FIG. 12 shows one possible process line for inlays. A web 101 comprising straps (strap=a substrate comprising an impedance matching element on its surface) one after the other on the surface of the web is unwound from a roll 102. Adhesive for attaching an integrated circuit on a chip to the strap is dispensed from an adhesive unit 103. The adhesive can be for example an anisotropically conductive adhesive. The chip is attached to the strap in a chip attachment unit 104. The adhesive is cured in a curing unit 105. Thus, a structural module web 107 comprising sequential structural modules is formed. The structural module web 107 is tested for the functionality of the structural modules in a testing unit 106. After the testing unit 106 there is a buffer 108 which levels out possible speed differences between the left side and the right side of the process line. After the buffer 108 there is a slitting unit 109.

A face web 112 is unwound from a roll 111. The face web 112 can be for example a paper web. The face web 112 can be printed or blank. The antenna strip, i.e. the antenna, is formed in a printing unit 113. Another alternative is to attach an electrically conductive foil strip to the face web 112. It is also possible that the same methods and materials are used as in the manufacture of the impedance matching elements. After that, hot-melt adhesive is applied selectively (only the area in which the structural module is due to be applied is covered with the adhesive) onto the surface of the face web 112 in a hot-melt adhesive unit 114.

The individual structural modules (i.e. straps) are attached to the surface of the face web 112 in a dispensing unit 110 in which the sequential structural modules are separated from each other, i.e. the structural module web 107 is cut into individual structural modules. At the same time, the structural modules are tested and the poor ones are removed. A back web 116 is unwound from a roll 115. The back web 116 can be, for example, a release liner. Hot-melt adhesive is applied onto the surface of the back web 116 in a hot-melt adhesive unit 117. Alternatively, it is possible that the hot-melt adhesive is applied to the whole area of the face web 112 in the hot-melt adhesive unit 114. In that case, the hot-melt adhesive unit 117 can be omitted. The face web 112 and the back web 116 are laminated together in a lamination nip 118 to form an RFID tag web 119. The RFID tag web 119 is die-cut into individual RFID tags in a die-cutting unit 120. The individual RFID tags are on the surface of the back web 116, i.e. on the surface of the release liner. A trash web 121 is wound onto a roll 122.

The ready tags (labels) on the surface of the back web 116 are separated from each other in the cross-machine direction in a slitting unit 123. The ready labels travel through a main pull unit 124 to a tester 125 which tests the functionality of the transponders. At the end of the process line there is a printing unit 126, for example an ink-jet printing unit, for printing the labels. Finally, the back web 116 having printed labels on its surface, is wound to a roll 127.

One skilled in the art will readily realize that certain elements of the manufacturing line can be transposed. For example, the back web 116 and the face web 112 can be transposed. It is also clear that the hot-melt adhesive units can be replaced by the transfer lamination process.

The lamination of the antenna strip can also take place before the lamination of the structural module or preprinted materials can be used (a preprinted label face, a preprinted antenna strip).

Another possibility is that the label stock is purchased with the antenna strip already laminated during the manufacture of the label stock. The process may run as described above in the description of FIG. 9, but the printing unit 113 (or the antenna strip application unit) can be omitted.

The strap may include a substrate, a chip and conductive leads which are connected to the chip. The leads may be capacitively connected to an antenna on the face web. Besides the above-mentioned parts it is possible that the strap includes e.g. short circuit elements.

It is also possible to manufacture the tag without the strap, i.e. the chip is directly attached to the antenna. All materials and methods described above can also be applied in that manufacturing method.

What is claimed is:

1. An RFID tag comprising:
   a heat-resistant substrate including a plastic film and capable of withstanding temperatures up to 200° C.,
   an antenna positioned on the surface of the substrate,
   an integrated circuit on a silicon chip electrically connected to the antenna,
   a joint for attaching the chip to the substrate so that the chip is capable of connecting electrically to the antenna,
   the joint comprising an anisotropically conductive adhesive capable of withstanding temperatures up to 200° C. and having a thermal expansion coefficient essentially similar to that of the silicon chip.

2. The RFID tag according to claim 1, wherein the anisotropically conductive adhesive comprises a modified addition compound of an epoxy amine.

3. The RFID tag according to claim 2, wherein the anisotropically conductive adhesive comprises metallic particles.

4. The RFID tag according to claim 1, wherein the silicon chip comprises two antenna ports including four bumps attached to the substrate through the joint.

5. The RFID tag according to claim 1, further comprising supporting arms are arranged at least partially around the silicon chip.

6. The RFID tag according to claim 1, further comprising two impedance matching loops.

7. The RFID tag according to claim 1, further comprising a hermetic encapsulation, encapsulating the silicon chip.

8. The RFID tag according to claim 1, further comprision an overlay positioned on top of the chip and the antenna.

9. The RFID tag according to claim 8, wherein the overlay comprising at least one of paper and polynaphtalene (PEN).

* * * * *